United States Patent
Kuo et al.

(10) Patent No.: US 10,852,635 B2
(45) Date of Patent: Dec. 1, 2020

(54) COMPACT MODELING FOR THE NEGATIVE TONE DEVELOPMENT PROCESSES

(71) Applicant: Synopsys, Inc., Mountain View, CA (US)

(72) Inventors: Chun-Chieh Kuo, Hsinchu (TW); Jensheng Huang, San Jose, CA (US); Lawrence S. Melvin, III, Hillsboro, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/905,555

(22) Filed: Feb. 26, 2018

(65) Prior Publication Data

US 2019/0072847 A1 Mar. 7, 2019

Related U.S. Application Data

(60) Provisional application No. 62/464,315, filed on Feb. 27, 2017.

(51) Int. Cl.
*G06F 30/00* (2020.01)
*G03F 1/36* (2012.01)
*H01L 21/027* (2006.01)
*G03F 7/20* (2006.01)

(52) U.S. Cl.
CPC .............. *G03F 1/36* (2013.01); *G03F 7/2026* (2013.01); *G03F 7/705* (2013.01); *G03F 7/70441* (2013.01); *H01L 21/0274* (2013.01)

(58) Field of Classification Search
CPC .................................. G03F 1/36; G03F 7/2026
USPC ............................................................ 716/53
See application file for complete search history.

(56) References Cited

U.S. PATENT DOCUMENTS

| | | | |
|---|---|---|---|
| 7,954,071 B2 * | 5/2011 | Barnes | G03F 7/70433 716/53 |
| 8,846,305 B2 | 9/2014 | Kim et al. | |
| 2005/0015233 A1 * | 1/2005 | Gordon | G03F 1/36 703/13 |

(Continued)

OTHER PUBLICATIONS

Chen et al. "Evaluation of compact models for negative-tone development layers at 20/14nm nodes," Optical Microlithography XXVIII, (SPIE) 94261P, 13 pages, doi:10.1117/12.2085711, (2015).

(Continued)

*Primary Examiner* — Suchin Parihar
(74) *Attorney, Agent, or Firm* — Alston & Bird LLP

(57) ABSTRACT

A photolithography model used in an optical proximity correction process modifies an image output intensity of a point disposed along a two dimensional plane and having coordinates (x,y) in accordance with a gradient of a convolution of a mask value at the point and a sampling pattern function selected at the point. The sampling pattern function includes, in part, a first subset of sampling patterns and a second subset of sampling patterns. The first subset of sampling patterns includes first and second nodes. The second subset of sampling patterns include first and second antinodes. The gradient of the convolution of the mask value and the first and second nodes of the first subset are scaled by a first coefficient. The gradient of the convolution of the mask value and the first and second antinodes of the second subset are scaled by a second coefficient.

20 Claims, 4 Drawing Sheets

(56) References Cited

U.S. PATENT DOCUMENTS

| | | | |
|---|---|---|---|
| 2008/0208545 A1* | 8/2008 | Lin | B82Y 10/00 |
| | | | 703/2 |
| 2013/0045591 A1 | 2/2013 | Shaw et al. | |
| 2017/0147733 A1* | 5/2017 | Rosenbluth | G03F 1/36 |
| 2018/0017873 A1* | 1/2018 | Biafore | G03F 7/325 |
| 2019/0072847 A1* | 3/2019 | Kuo | H01L 21/0274 |

OTHER PUBLICATIONS

Dill, "Optical Lithography," IEEE Transactions on Electron Devices, 22(7):440-444, doi:10.1109/T-ED.1975.18158, (1975).

Gao et al., "Application of an inverse Mack model for negative tone development simulation," SPIE Proceedings Optical Microlithography XXIV 7973, 10 pages, doi:10.1117/12.880949, (2011).

Landie et al. "Fundamental investigation of negative tone development (NTD) for the 22nm node (and beyond)." Proc. SPIE 7972, Advances in Resist Materials and Processing Technology XXVIII, 13 pages, doi:10.1117/12.882843, (2011).

Robertson et al., "Negative tone development: gaining insight through physical simulation," SPIE Proceedings Advances in Resist Materials and Processing Technology XXVIII 7972, 12 pages, doi:10.1117/12.879506, (2011).

Kuo et al., "Compact Modeling for the Negative Tone Development Processes," Synopsys, Inc., 5 pages, (2017).

\* cited by examiner

COMPACT MODELING FOR THE NEGATIVE TONE DEVELOPMENT PROCESSES

CROSS-REFERENCE TO RELATED APPLICATIONS

The present application claims benefit under 35 USC 119 (e) of U.S. Provisional Application Ser. No. 62/464,315, entitled "Compact Modeling for the Negative Tone Development Processes" filed Feb. 27, 2017, the contents of which is incorporated herein by reference in its entirety.

TECHNICAL FIELD

The present disclosure relates to manufacturing of semiconductor devices, and more particularly to photolithographic processes used in manufacturing of an integrated circuit.

BACKGROUND OF THE INVENTION

The negative tone development (NTD) process has helped to produce the necessary image fidelity for recent manufacturing nodes. However, despite the process improvements realized with the NTD, accurate simulation of the underlying process has proved elusive. First principle simulations use methods, such as Finite Difference Time Domain analysis, that are accurate and produce data through focus, exposure energy, depth, and other parameters. Compact modeling used in optical proximity correction (OPC) and resolution enhancement technologies have proven more difficult to achieve the same level of accuracy as the NTD. However, first principle models are computationally expensive, relegating them to simulating small areas of a layout. Compact models generally predict limited output data about a pattern, which is usually a value related to such as optical intensity at a single point. Such limited output data—which is usually related to the optical intensity at a single point—enables the compact model to compute information quickly, thus making the model suitable for full-chip simulation in OPC.

The NTD poses a difficulty for compact modeling methodologies and is characterized by a volume change. The volume change that modifies the critical dimensions (CD) during post exposure resist processing is mechanical in nature and is hypothesized to be due to outgassing during the development process. However, compact models are optimized to work with optical effects such as diffraction. The inclusion of mechanical effects into the compact model has the potential to dramatically degrade runtime performance, which will result in the undesired outcome of increased tape-out time. Therefore, an NTD model capable of modeling optical phenomena is highly desirable.

SUMMARY OF THE INVENTION

A computer implemented method for modeling a photolithography used in an optical proximity correction process and associated with an integrated circuit, in accordance with one embodiment of the present invention, includes, in part, modifying an image output intensity of a point disposed along a two dimensional plane and having coordinates (x,y) in accordance with a gradient of a convolution of a mask value at the point and a sampling pattern function selected at the point. In one embodiment, the sampling pattern function includes, in part, a first subset of sampling patterns and a second subset of sampling patterns.

In one embodiment, the first subset of sampling patterns includes first and second nodes. In one embodiment, the second subset of sampling patterns comprises first and second antinodes. In one embodiment, the gradient of the convolution of the mask value and the first and second nodes of the first subset are scaled by a first coefficient. In one embodiment, the gradient of the convolution of the mask value and the first and second antinodes of the second subset are scaled by a second coefficient.

In one embodiment, the first and second coefficients are obtained by a regression analysis. In one embodiment, the image output intensity is obtained by the Dill model. In another embodiment, the image output intensity is obtained by the Hopkins model. In yet another embodiment, the image output intensity is obtained by the inverse Mack model.

A computer system configured to model a photolithography used in an optical proximity correction process associated with an integrated circuit, is further configured to modify an image output intensity of a point disposed along a two dimensional plane and having coordinates (x,y) in accordance with a gradient of a convolution of a mask value at the point and a sampling pattern function selected at the point. In one embodiment, the sampling pattern function includes, in part, a first subset of sampling patterns and a second subset of sampling patterns.

In one embodiment, the first subset of sampling patterns includes first and second nodes. In one embodiment, the second subset of sampling patterns comprises first and second antinodes. In one embodiment, the gradient of the convolution of the mask value and the first and second nodes of the first subset are scaled by a first coefficient. In one embodiment, the gradient of the convolution of the mask value and the first and second antinodes of the second subset are scaled by a second coefficient.

In one embodiment, the first and second coefficients are obtained by a regression analysis. In one embodiment, the image output intensity is obtained by the Dill model. In another embodiment, the image output intensity is obtained by the Hopkins model. In yet another embodiment, the image output intensity is obtained by the inverse Mack model.

DETAILED DESCRIPTION OF THE INVENTION

In accordance with one embodiment of the present invention, negative tome development (NTD) processes are characterized by a compact model. In one embodiment, a sampling pattern adapted to identify regions impacted by the NTD phenomena is used to model compensation for the phenomena. A sampling pattern is understood herein to refer to a pattern designed to interact with a drawn device pattern in a manner that renders the resulting pattern mathematically tractable. Such a sampling pattern is useful in identifying specific features such as line ends or a single pitch and has a minimal impact on computation time.

Figure 1:
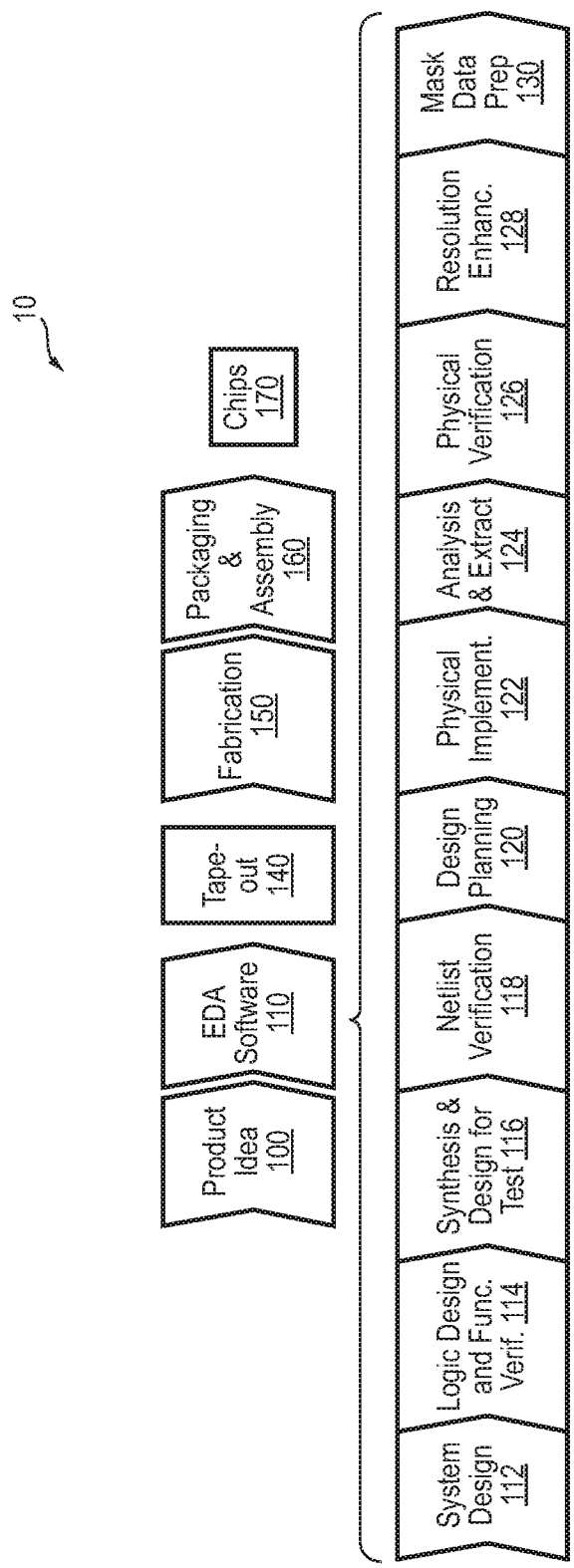
FIG. 1 shows simplified exemplary steps performed in the design and fabrication of an integrated circuit.

FIG. 1 depicts simplified exemplary steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests can be designed and implemented to check the finished chips. In the netlist verification 118, the netlist can be checked for compliance with timing constraints and for correspondence with the HDL code. In the design planning 120, an overall floor plan for the chip can be constructed and analyzed for timing and top-level routing. Next, in the physical implementation 122, placement and routing can be performed.

In the analysis and extraction 124, the circuit functionality can be verified at a transistor level. In the physical verification 126, the design can be checked to correct any functional, manufacturing, electrical, or lithographic issues. In the resolution enhancement 128, geometric manipulations can be performed on the layout to improve manufacturability of the design. Finally, in the mask data preparation 130, the design can be taped-out 140 for production of masks to produce finished chips. The embodiments of the present invention may be used, for example, at mask data preparation 130.

An NTD model, in accordance with embodiments of the present invention, generate an offset to the intensity parameter supplied using any standard OPC compact photoresist model, such as the well-known Dill's model or an inverse Mack model.

For example, the Dill's model may be formulated as follows:

$$\alpha = AM(x, y, t) + B \quad (1)$$

$$\frac{\partial M(x, y, t)}{\partial t} = -I(x, y, t)M(x, y, t)C \quad (2)$$

In accordance with one embodiment of the present invention, an offset to the intensity value—derived using any standard OPC compact photoresist model, such as Dill's or Mack's—is obtained via a sampling pattern used to identify regions of a pattern impacted by the NTD. The intensity offset $\Delta I_{NTD}(x,y)$ at any point having (x,y) coordinates on the mask and impacted by the NTD may be computed using the following equation:

$$\Delta I_{NTD}(x,y) = C_{IG}\nabla(\text{Mask}(x,y)*K_{NTDG}(x,y)) + C_{IK}\nabla(\text{Mask}(x,y)*K_{NTDK}(x,y)) \quad (5)$$

In the above equation (5), "$\nabla$" represents the gradient operator, "*" represents the convolution operation, $C_{IG}$ and $C_{IK}$ are constants that may be obtained through regression analysis converting the convolution gradient to a normalized intensity difference, Mask(x,y) represents the simulated pattern on the mask at coordinates (x,y), $K_{NTDG}(x,y)$ represents a first subset of a sampling pattern at coordinates (x,y), and $K_{NTDK}(x,y)$ represents a second subset of the sampling pattern at coordinates (x,y).

Figure 2A:
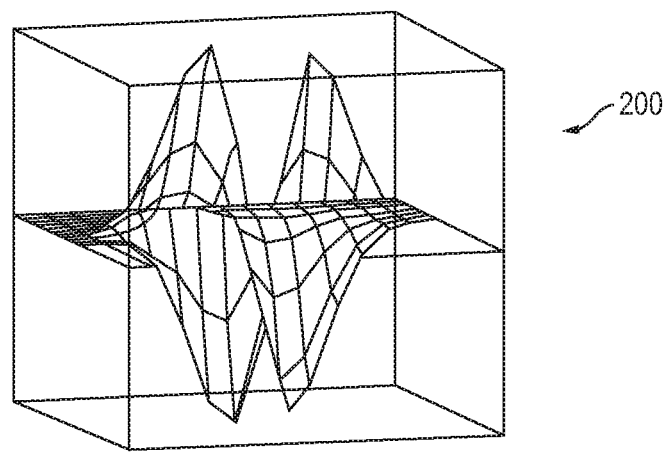
FIG. 2A shows an exemplary sampling pattern, in accordance with one embodiment of the present invention.
Figure 2B:
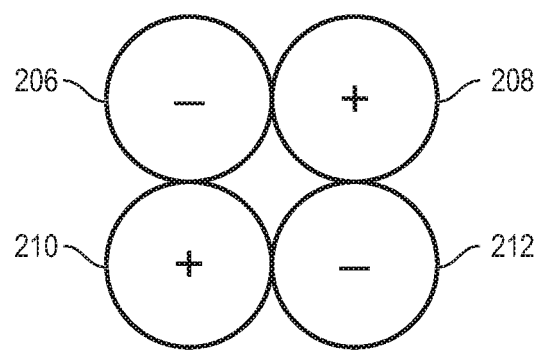
FIG. 2B is a top view of the sampling pattern shown in FIG. 1A.

FIG. 2A shows an exemplary sampling pattern 200 defining parameters $K_{NTDG}$ and $K_{NTDK}(x,y)$ at any arbitrary coordinates (x,y). FIG. 2B is a top view of the sampling pattern 200 shown in FIG. 2A. As is seen from FIG. 2B, sampling patterns 200 is shown as including a first subset defined by patterns 208, 210 (also referred to herein as nodes 208, 210) and a second subset defined by patterns 206 and 212 (also referred to herein as antinodes 206, 212).

Exemplary sampling pattern 200 is designed to generate a signal around two-dimensional pattern features. As is seen from equation (5) above, the gradient of the convolution operation of the mask pattern and the sampling pattern at any given coordinates(x,y), in accordance with embodiments of the present invention, generates an offset to the intensity $\Delta I_{NTD}$ at those coordinates which is used to modify the intensity obtained using any standard OPC compact photoresist model. For example, when using the Dill model, the intensity generated at any given coordinates (x, y), may be obtained using the following expression:

$$I = I_{optical} + I_{Dill} + \Delta I_{NTD} \quad (6)$$

An intensity offset $\Delta I_{NTD}$ obtained using a sampling pattern, in accordance with embodiments of the present invention, generates a value around line ends as well as any other two-dimensional features associated with the pattern. The sampling pattern also generates a mathematically smooth transition from two-dimensional feature-dominated pattern regions to one-dimensional pattern regions. The height, diameter, and placement of nodes 208, 210 as well antinodes 206, 212 in $K_{NTDG}(x,y)$ and $K_{NTDK}(x,y)$ may be varied through regression and may be defined as shown below:

$$K_{NTDG}(x,y) = \text{Disk}(x,y,RG_1,SG_1) - \text{Disk}(x,y,RG_2,SG_2) \quad (7)$$

$$K_{NTDK}(x,y) = \text{Disk}(x,y,RG_1,SG_1) - \text{Disk}(x,y,RG_2,SG_2) \quad (8)$$

In equations (6) and (7), $RG_1$, $SG_1$, $RG_2$, $SG_2$ are tuned values to make the proper sized form. Parameter Disk may be defined as:

$$\text{Disk} = \text{erf}\left(\frac{R-r}{\sqrt{2}s}\right)$$

if s≠0 or when s=0 or 1 if r=<R and 0 if r>R where r is the radius defined by ($\sqrt{x^2+y^2}$) and s is the standard deviation.

In one embodiment, the intensity offset $\Delta I_{NTD}$ is generated for two-dimensional features of a pattern or interactions with nearby two-dimensional features of a pattern. A two-dimensional feature of a pattern is an area of the pattern that is imaged using high-order optical components. An example of such a two-dimensional feature is a line end, as well as any nearby patterns. A nearby pattern associated with a region may be on the order of a wavelength of the light being used but may vary depending on other factors. A one-dimensional pattern may be mostly imaged by low-order optical components. For example, the edge of parallel lines many times longer than the optical wavelength in a group of parallel lines is a one-dimensional feature. The more corners added to a pattern either in design or in OPC, the more two-dimensional the pattern becomes.

Figure 3:
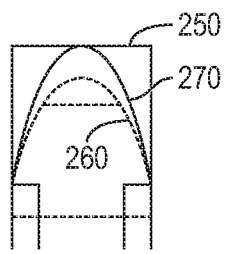
FIG. 3 shows a portion of an exemplary mask pattern.

FIG. 3 shows a portion of a mask pattern 250. Pattern 260 shows the simulation result of mask pattern 250 obtained using the Dill model. Pattern 270 shows the simulation result of mask pattern 250 obtained using an exemplary embodiment of the present invention in which an intensity offset is computed using equation (5) and the sampling patterns described above. As is seen from FIG. 3, pattern 270 more accurately simulates pattern 200 than pattern 205.

Figure 4:
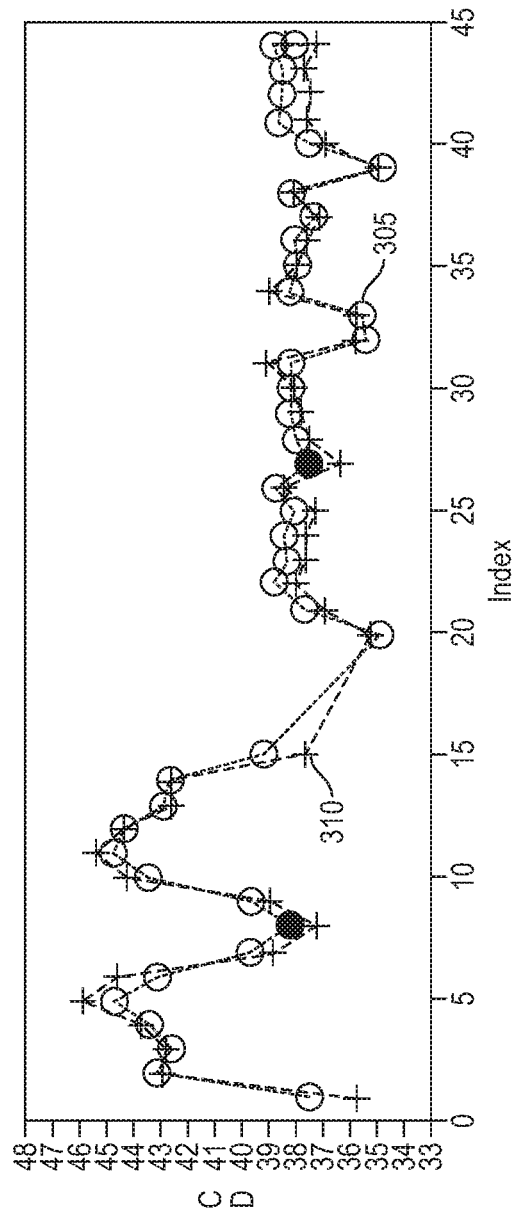
FIG. 4 is a plot of measured and computer simulated data generated using an intensity compensated NTD mode, in accordance with one embodiment of the present invention.

FIG. 4 is a plot of measured 305 and computer simulated data 310 generated using intensity compensated model as described above in accordance with embodiments of the present invention. In FIG. 4, the x-axis represents the index of each point in the test set and the y-axis represents the CD measurement of the point in the test pattern. Despite being more accurate, the runtime for an intensity compensated NTD model, in accordance with embodiments of the present invention, is similar to the runtime of a conventional OPC model.

Figure 5:
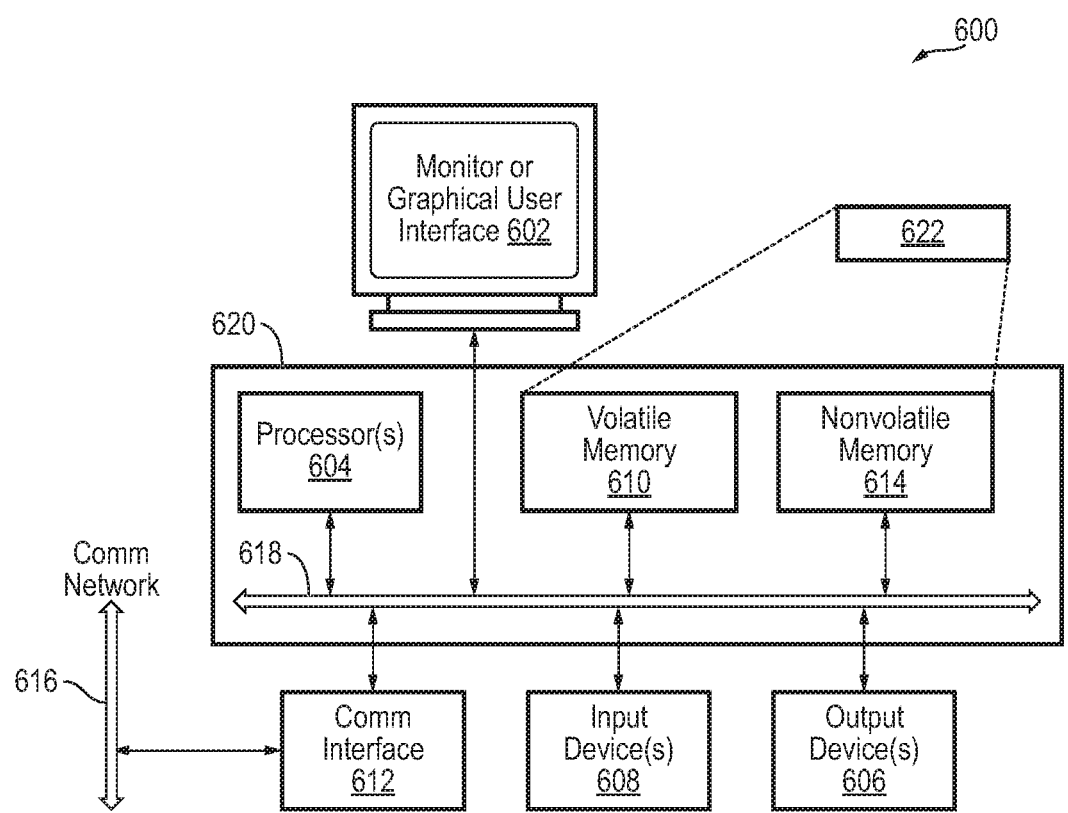
FIG. 5 is an exemplary block diagram of a computing device that may incorporate embodiments of the present invention.

FIG. 5 is an example block diagram of a computing device 600 that may incorporate embodiments of the present invention. FIG. 5 is merely illustrative of a machine system to carry out aspects of the technical processes described herein, and does not limit the scope of the claims. One of ordinary skill in the art would recognize other variations, modifications, and alternatives. In one embodiment, the computing device 600 typically includes a monitor or graphical user interface 602, a data processing system 620, a communication network interface 612, input device(s) 608, output device(s) 606, and the like.

As depicted in FIG. 5, the data processing system 620 may include one or more processor(s) 604 that communicate with a number of peripheral devices via a bus subsystem 618. These peripheral devices may include input device(s) 608, output device(s) 606, communication network interface 612, and a storage subsystem, such as a volatile memory 610 and a nonvolatile memory 614.

The volatile memory 610 and/or the nonvolatile memory 614 may store computer-executable instructions and thus forming logic 622 that when applied to and executed by the processor(s) 604 implement embodiments of the processes disclosed herein.

The input device(s) 608 include devices and mechanisms for inputting information to the data processing system 620. These may include a keyboard, a keypad, a touch screen incorporated into the monitor or graphical user interface 602, audio input devices such as voice recognition systems, microphones, and other types of input devices. In various embodiments, the input device(s) 608 may be embodied as a computer mouse, a trackball, a track pad, a joystick, wireless remote, drawing tablet, voice command system, eye tracking system, and the like. The input device(s) 608 typically allow a user to select objects, icons, control areas, text and the like that appear on the monitor or graphical user interface 602 via a command such as a click of a button or the like.

The output device(s) 606 include devices and mechanisms for outputting information from the data processing system 620. These may include speakers, printers, infrared LEDs, and so on as well understood in the art.

The communication network interface 612 provides an interface to communication networks (e.g., communication network 616) and devices external to the data processing system 620. The communication network interface 612 may serve as an interface for receiving data from and transmitting data to other systems. Embodiments of the communication network interface 612 may include an Ethernet interface, a modem (telephone, satellite, cable, ISDN), (asynchronous) digital subscriber line (DSL), FireWire, USB, a wireless communication interface such as BlueTooth or WiFi, a near field communication wireless interface, a cellular interface, and the like.

The communication network interface 612 may be coupled to the communication network 616 via an antenna, a cable, or the like. In some embodiments, the communication network interface 612 may be physically integrated on a circuit board of the data processing system 620, or in some cases may be implemented in software or firmware, such as "soft modems", or the like.

The computing device 600 may include logic that enables communications over a network using protocols such as HTTP, TCP/IP, RTP/RTSP, IPX, UDP and the like.

The volatile memory 610 and the nonvolatile memory 614 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 610 and the nonvolatile memory 614 may be configured to store the basic programming and data constructs that provide the functionality of the disclosed processes and other embodiments thereof that fall within the scope of the present invention.

Logic 622 that implements embodiments of the present invention may be stored in the volatile memory 610 and/or the nonvolatile memory 614. Said software may be read from the volatile memory 610 and/or nonvolatile memory 614 and executed by the processor(s) 604. The volatile memory 610 and the nonvolatile memory 614 may also provide a repository for storing data used by the software.

The volatile memory 610 and the nonvolatile memory 614 may include a number of memories including a main random access memory (RAM) for storage of instructions and data during program execution and a read only memory (ROM) in which read-only non-transitory instructions are stored. The volatile memory 610 and the nonvolatile memory 614 may include a file storage subsystem providing persistent (non-volatile) storage for program and data files. The volatile memory 610 and the nonvolatile memory 614 may include removable storage systems, such as removable flash memory.

The bus subsystem 618 provides a mechanism for enabling the various components and subsystems of data processing system 620 communicate with each other as intended. Although the communication network interface 612 is depicted schematically as a single bus, some embodiments of the bus subsystem 618 may utilize multiple distinct busses.

It will be readily apparent to one of ordinary skill in the art that the computing device 600 may be a device such as a smartphone, a desktop computer, a laptop computer, a rack-mounted computer system, a computer server, or a tablet computer device. As commonly known in the art, the computing device 600 may be implemented as a collection of multiple networked computing devices. Further, the computing device 600 will typically include operating system logic (not illustrated) the types and nature of which are well known in the art.

Those having skill in the art will appreciate that there are various logic implementations by which processes and/or systems described herein can be effected (e.g., hardware, software, or firmware), and that the preferred vehicle will vary with the context in which the processes are deployed. If an implementer determines that speed and accuracy are paramount, the implementer may opt for a hardware or firmware implementation; alternatively, if flexibility is paramount, the implementer may opt for a solely software implementation; or, yet again alternatively, the implementer may opt for some combination of hardware, software, or firmware. Hence, there are numerous possible implementations by which the processes described herein may be effected, none of which is inherently superior to the other in that any vehicle to be utilized is a choice dependent upon the context in which the implementation will be deployed and the specific concerns (e.g., speed, flexibility, or predictability) of the implementer, any of which may vary. Those skilled in the art will recognize that optical aspects of implementations may involve optically-oriented hardware, software, and or firmware.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

The foregoing detailed description has set forth various embodiments of the devices or processes via the use of block diagrams, flowcharts, or examples. Insofar as such block diagrams, flowcharts, or examples contain one or more functions or operations, it will be understood as notorious by those within the art that each function or operation within such block diagrams, flowcharts, or examples can be implemented, individually or collectively, by a wide range of hardware, software, firmware, or virtually any combination thereof. Portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more processing devices (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory.

In a general sense, those skilled in the art will recognize that the various aspects described herein which can be implemented, individually or collectively, by a wide range of hardware, software, firmware, or any combination thereof can be viewed as being composed of various types of circuitry.

The above embodiments of the present invention are illustrative and not limitative. The above embodiments of the present invention are not limited to any optical wavelength or pattern shape. Other additions, subtractions or modifications are obvious in view of the present disclosure and are intended to fall within the scope of the appended claims.

What is claimed is:

1. A computer implemented method for modeling a photolithography used in an optical proximity correction process associated with an integrated circuit, the method comprising:
    generating an image output intensity value of a point disposed along a two-dimensional plane within a mask pattern and having coordinates (x, y);
    generating signals around two-dimensional pattern features of the mask pattern;
    determining an offset value intensity at the point based at least in part on a gradient function of a convolution operation generated at least in part on the signals generated around the two-dimensional pattern features of the mask pattern and the sampling pattern function; and
    modifying the image output intensity of the point based at least in part on the offset value intensity.

2. The computer implemented method of claim 1, wherein said sampling pattern function comprises a first subset of sampling patterns and a second subset of sampling patterns.

3. The computer implemented method of claim 2, wherein said first subset of sampling patterns comprises first and second nodes.

4. The computer implemented method of claim 3, wherein said second subset of sampling patterns comprises first and second antinodes.

5. The computer implemented method of claim 4, wherein a gradient of the convolution of the mask value and the first and second nodes of the first subset are scaled by a first coefficient.

6. The computer implemented method of claim 5, wherein a gradient of the convolution of the mask value and the first and second antinodes of the second subset are scaled by a second coefficient.

7. The computer implemented method of claim 6, wherein said first and second coefficients are obtained by a regression analysis.

8. The computer implemented method of claim 1, wherein said image output intensity is obtained by a Dill model.

9. The computer implemented method of claim 1, wherein said image output intensity is obtained by a Hopkins model.

10. The computer implemented method of claim 1, wherein said image output intensity is obtained by an inverse Mack model.

11. A computer system configured to model a photolithography used in an optical proximity correction process associated with an integrated circuit, the computer system further configured to:
generate an image output intensity value of a point disposed along a two-dimensional plane within a mask pattern and having coordinates (x, y);
generate signals around two-dimensional pattern features of the mask pattern;
determine an offset value intensity at the point based at least in part on a gradient function of a convolution operation generated at least in part on the signals generated around the two-dimensional pattern features of the mask pattern and the sampling pattern function; and
modify the image output intensity of the point based at least in part on the offset value intensity.

12. The computer system of claim 11, wherein said sampling pattern function comprises a first subset of sampling patterns and a second subset of sampling patterns.

13. The computer system of claim 12, wherein said first subset of sampling patterns comprises first and second nodes.

14. The computer system of claim 13, wherein said second subset of sampling patterns comprises first and second antinodes.

15. The computer system of claim 14, wherein a gradient of the convolution of the mask value and the first and second nodes of the first subset are scaled by a first coefficient.

16. The computer system of claim 15, wherein a gradient of the convolution of the mask value and the first and second antinodes of the second subset are scaled by a second coefficient.

17. The computer system of claim 16, wherein said first and second coefficients are obtained by a regression analysis.

18. The computer system of claim 11, wherein said image output intensity is obtained by a Dill model.

19. The computer system of claim 11, wherein said image output intensity is obtained by a Hopkins model.

20. The computer system of claim 11, wherein said image output intensity is obtained by an inverse Mack model.

* * * * *